US006829183B2

United States Patent
Braceras

(10) Patent No.: US 6,829,183 B2
(45) Date of Patent: Dec. 7, 2004

(54) ACTIVE RESTORE WEAK WRITE TEST MODE

(75) Inventor: George M. Braceras, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/665,254

(22) Filed: Sep. 20, 2003

(65) Prior Publication Data

US 2004/0062105 A1 Apr. 1, 2004

Related U.S. Application Data

(62) Division of application No. 10/064,568, filed on Jul. 26, 2002, now Pat. No. 6,711,076.

(51) Int. Cl.[7] .................................................. G11C 7/00
(52) U.S. Cl. .................. 365/201; 365/200; 365/230.06; 365/185.09; 365/185.2; 365/210
(58) Field of Search ................................. 365/201, 200, 365/230.06, 185.09, 185.2, 210

(56) References Cited

U.S. PATENT DOCUMENTS

| 5,748,543 A | * | 5/1998 | Lee et al. ..................... 365/200 |
| 5,835,429 A | * | 11/1998 | Schwarz ...................... 365/201 |
| 6,006,339 A | * | 12/1999 | McClure ...................... 713/500 |
| 6,016,281 A | * | 1/2000 | Brox ....................... 365/230.06 |
| 6,192,001 B1 | * | 2/2001 | Weiss et al. ........... 365/230.06 |
| 6,208,572 B1 | | 3/2001 | Adams et al. .............. 365/201 |
| 6,333,872 B1 | * | 12/2001 | Ouellette et al. ...... 365/189.06 |
| 6,449,200 B1 | * | 9/2002 | Nelson et al. .............. 365/201 |

* cited by examiner

Primary Examiner—Connie C. Yoha
(74) Attorney, Agent, or Firm—Robert A. Walsh

(57) ABSTRACT

A semiconductor memory device having an active restore weak write test mode for resistive bitline contacts. During the write margin test a circuit is used to block the bitline restore devices from turning off during the SRAM write cycle.

4 Claims, 9 Drawing Sheets

ACTIVE RESTORE WEAK WRITE TEST MODE

This application is a divisional of Ser. No. 10/064,568; filed on Jul. 26, 2002 now issued as U.S. Pat. No. 6,711,076 B2.

BACKGROUND OF THE INVENTION

FIG. 1A shows a conventional static random access memory ("SRAM") cell 50, which is represented on a transistor level at 50A and on a more general gate level at 50B. On the transistor level, cell 50 includes PFET transistors M1 and M2 and NFET transistors M3 through M6. Transistors M1 and M3 are configured as a conventional inverter, which is shown as U2 in FIG. 1A. Likewise, transistors M2 and M4 are configured as a conventional static inverter, which is shown as U1 in FIG. 1A. Inverter M1/M3 (U2) is cross-coupled with inverter M2/M4 (U1) to form the memory storage portion of cell 50. The input of inverter M2/M4 (U1), which is connected to the output of inverter M1/M3 (U2) provides a true data storage node (A), and the input of inverter M1/M3 (U2), which is connected to the output of inverter M2/M4 (U1), provides a compliment data storage node (B). Transistors M5 and M6 function as switches to control access to the cell internal nodes A and B from the differential bitline, comprised of the true bitline BLT and the compliment bitline BLC. Their gates are connected to a Word Line ("LWL") signal that when active (high) enables writing to and reading from the SRAM memory cell nodes A and B. The structure formed by inverters U1 and U2 is known as a cross-coupled inverter, or a latch, and is naturally a bistable element capable of storing either a '1' or a '0'. The cell will always resolve nodes A and B to either a '1' or '0' and maintain this state unless the cell contains a defective device or connection. Detecting such defects during the SRAM test flow is often difficult and time consuming, and is the focus for this invention. The following description on how the SRAM cell functions will provide further background for the invention.

FIG. 2 shows a block diagram for an SRAM subarray. The subarray is a relatively small SRAM block containing all the necessary memory components needed to control the SRAM memory element or cell. A large SRAM chip will be comprised of many subarrays, each controlled and activated by a unique address. The subarray consists of an array of SRAM cells (10) arranged in rows and columns; local wordline drivers to control the row activation (11); subarray control circuitry (12) to synchronize and select the SRAM read and write operations; and column data path circuits comprised of the bitline restore devices (13), bitswitch multiplexors (14), and the data sense amplifier and write drivers (15). The column circuitry (16) and the local wordline drivers (11) are known as pitch circuits because they must physically reside on pitch with the SRAM cell. The small dimensions of the SRAM cell make it desirable to keep these pitch circuits as small and simple as possible to prevent an unnecessary increase to the memories size.

FIG. 3. expands into the subarray to show the circuits in more detail. For simplicity, only one SRAM cell is shown, along with the necessary column circuits. Functional blocks are used to describe the subarray controls (blocks 20,21,22, 23, and 25) and local wordline drivers (24). Prior to selecting the subarray to perform either an SRAM read or write cycle, the control inputs to the subarray are precharged low. These signals consist of a subarray select signal (30), the global wordline GWL (31), a column address COLADDR (32), and write control WRT (33). In the unselected state, the subarray will have internal subarray signal COLSEL (35) low. This results in all array control signals being placed in the unselected or precharged state. The local wordline LWL (36) will be low turning off the cell access transistors M5 and M6 and isolating them from the bitlines BLT/BLC; column multiplexor bitswitch signals RBSW (37) and WBSW (38) are high and low, respectively, isolating the columns bitline from the sense amplifier data lines DLT/DLC; and both the bitline precharge BLR (39) and the data line precharge SAMPRES (40) are active low, precharging the bitlines BLT/BLC and data lines DLT/DLC high. The bitline precharge PFETS consist of devices M7, M8, and M9, while the data line precharge devices consist of PFETS M14, M15, and M16. With the subarray signals all in the precharge state, the SRAM access is ready to begin.

The SRAM read begins when the subarray select 30 drives active high. SRAM address signals will select one global wordline GWL (31) to activate, and one of the column address signals COLADDR (32). The write control signal WRT (33) will remain low during the SRAM read cycle. The internal subarray signal COLSEL (35) will now drive high to start preparing the SRAMs controlling signals for the read operation. COLSEL (35) acts as a local synchronizing clock to precisely time the critical SRAM control signals. In this manner the bitline precharge BLR (39) and data line precharge SAMPRES (40) drive high to turn off precharge devices M7, M8, M9, M14, M15, and M16 at the same time the local wordline LWL (36) selects high and the read bitswitch signal RBSW (37) drives low to electrically connect the array bitlines BLT/BLC to the sense amplifiers data lines DLT/DLC through devices M10 and M13. With the bitline and data line precharge devices off, and cell devices M5 and M6 turned on when the local wordline LWL (36) drives high, the cell can now take control. If the cell contains a logical '1' with node A low and B high, the bitline BLT will start to discharge through devices M5 and M3 (NFET of inverter U2, see FIG.1A), while BLC remains high near the power supply rail Vdd. With bitswitch PFETs M10 and M13 opened the data line signals DLT/DLC will follow the bitlines and node DLT will start to discharge. For reference, FIG. 6C. shows a simulation of the SRAM control signals on the top plot and the bitlines BLT/BLC and data lines DLT/DLC on the lower plot. Because the SRAM cell devices are very small and the bitline capacitance is relatively high, owing to the fact that many cells are connected onto and share a bitline, bitline BLT will discharge to ground very slowly. An amplifier circuit (comprised here of devices M16, M17, M18, M19 and M20) is used to increase the performance of the SRAM read by amplifying a small difference between data line signals DLT/DLC to full CMOS levels (Vdd and GND). This prevents the cell from having to fully drive the bitlines and data lines to ground, significantly improving the cells read performance. The differential voltage between DLT and DLC is referred to as the signal margin. It is critical to allow enough differential to develop for a reliable amplification, but not so much differential that performance suffers. A timing system is used to precisely control the sense amplifier circuit. In this case a mimic, or dummy wordline DWL (41) is used to provide tracking with the array wordline. Signal DWL will control the sense amplifier control circuit (21) to time and activate the sense amplifier set signal SET (42). SET driving active high will turn on sense amplifier device M20 and allow the small differential voltage on data lines DLT/DLC to resolve to full CMOS levels. DLT will drive to ground, and DLC will remain high. To increase the performance of the amplification, the highly capacitive bitline signals are isolated from the data lines DLT/DLC at the same time the sense amplifier is activated. Read bitswitch signal RBSW goes high to turn off bitswitch PFETS M10 and M13. With the bitlines BLT/BLC no longer needed for signal development they are now be precharged for the next cycle by activating the bitline restore signal BLR (39) and turning on PFET devices M7, M8, and M9. The data line precharge will take place after signal SET (42) has been active long enough to transfer the amplified signal to the SRAMs global data bus (not shown) and subsequently to the next logic stage.

The SRAM write begins when the subarray select 30 drives active high. SRAM address signals will select one global wordline GWL (31) to activate, and one of the column address signals COLADDR (32). The write control signal WRT (33) will pulse high, distinguishing this cycle as an SRAM write instead of an SRAM read. The internal subarray signal COLSEL(35) will now drive high to start preparing the SRAMs controlling signals for the write operation. COLSEL(35) acts as a local synchronizing clock to precisely time the critical SRAM control signals. In this manner the bitline precharge BLR (39) turns off precharge devices M7, M8, and M9 at the same time the local wordline LWL (36) selects high and the write bitswitch signal WBSW (38) drives high to electrically connect the array bitlines BLT/BLC to the write drivers data lines DLTW/DLCW through devices M11 and M12. Because the sense amplifier and hence signals DLT/DLC are not used during the write operation, SAMPRES will remain active and data line restore devices M14, M15, and M16 will remain on. With WRT (33) high, the write driver circuitry consisting of devices U4, U5, U6, and U7 is active and, depending on the state of the write data WDATA (34), will pull either DLTW or DLCW to ground. Consequently, because the write bitswitch devices (M11,12) are opened, one of the bitlines BLT/BLC will also discharge to ground and be able to force the cell to flip state (i.e.. Be written). Continuing with the example from the previously described SRAM read, the SRAM cell's internal nodes A and B are respectively low and high to store a logical '1'. To change the cell's state to a logical '0', WDATA (34) needs to be low to enable the write driver to pull DLCW and hence BLC to ground, subsequently discharging cell node B through device M6. For reference, FIG. 6A. shows a simulation of the SRAM control signals during a write cycle on the top plot and the cell nodes A and B, bitlines BLT/BLC and data lines DLT/DLC on the lower plot. For optimal SRAM reliability, it has become necessary to margin the write cycle to find "weak" bitline contacts because SRAM cells can still be written when high resistances are placed in series with the bitline contacts. Various techniques have been developed to find these bad contacts in test, and provide some margin for the cells bitline contacts. One technique described in U.S. Pat. No. 6,192,001 uses a weak (smaller) write driver during a test mode to effectively weaken the write and make the cell fail for a lower bitline contact resistance. While this technique works, it can be difficult to implement because the write circuitry is on pitch with the SRAM's sense amplifier. Also, adding circuitry to the data input path can reduce the available write timing for the SRAM. Another technique described in U.S. Pat. No. 6,208,572 which simultaneously activates both wordlines that share a bitline contact to effectively halve the available write current, and thereby double the cells sensitivity to a resistive defect. However, improvements are required to further the reliability of SRAM 'weak' bitline contacts.

The two cross-coupled PFET pull-up transistors, M1 and M2, retain a "1" value (at nodes A and B) when written into the cell. These cross-coupled p-devices are designed to be strong enough to retain a 1 value in the cell indefinitely without any external refresh mechanism. However, if the P-devices are too weak due to a fabrication defect or a connection to either of the P devices is missing, the SRAM cell will no longer be able to hold its data indefinitely. The resulting fault in defective cell is referred to as a data retention fault (DRF) or a cell stability fault, depending on its severity. Thus, all SRAMs require some form of data retention and cell stability testing.

Traditionally, testing large static CMOS memory arrays for data retention faults (DRFs) and cell stability faults had been a time consuming and expensive effort. Test methods had also been partial in their test coverage. The algorithmic test methods used for detecting these faults were primarily functional in nature; that is they checked the cell stability or retention in a functional manner. These algorithmic test methods were time consuming and required extensive characterization of silicon to determine the worst case test conditions. Fortunately, improved test methodologies have been developed, which address these problems. One such test method is known as Weak Write Test Mode ("WWTM"). for additional information relating to weak write testing, as well as on more traditional methods, reference may be made to Meixner and Banik, Weak Write Test Mode: An SRAM Cell Design Stability Design For Test Technique, IEEE 0-78033540-6/96(1996), which is hereby incorporated by reference into this specification.

A weak write test is active—in contrast to former tests, which were passive. A WWTM circuit actively attempts to weakly overwrite a cell. It is only capable of overwriting an unstable cell due to the presence of a defect. If the cell can be weakly overwritten, it is assessed to be defective, and if it cannot be weakly overwritten, it is deemed healthy. A weak write test can be used to test an array of memory in much less time than the former passive tests.

FIG. 1B shows a WWTM circuit 60 for testing SRAM cell 50. Weak write tests are implemented with a row of WWTM circuits attached to the bit line pairs of a memory array. WWTM circuit 60 generally includes a PFET transistor Ma, an NFET transistor Mb, and pass gate MOS devices Mc through Mf. Transistor Ma provides a high signal to a High node of the circuit 60. Conversely, transistor Mb provides a low signal (ground) to a Low node. The WWTM circuit 60 includes BLT and BLC outputs that are respectively connected across the BLT and BLC inputs of he SRAM cell 50. The BLT output is selectively connected to the High node through pass gate Mc and selectively connects the Low node through pass gate Mf. Alternatively, the BLC output is selectively connected to the High node through pass gate Md and selectively connected to the Low node through pass gate Me. A WR1 input is connected to the gates of Mc and Mf for selecting them in order to weak write a "1" (i.e., apply a weak "1") at the memory cell. Conversely, a WR0 input is connected to the gates of pass gates Md and Me for selecting them in order to weak write a "0" at the memory cell. Transistors Ma and Mb are sized so that circuit 60 is not strong enough to override the value in a healthy cell yet strong enough to override the value in a defective cell.

WWTM circuit 60 may be used for implementing a weak write test in the following manner. Initially, a background of "0"s are written into a memory cell array. The WWTM circuit 60 is enabled, and a weak write "1" is written to the array, word line by word line, for a preselected time. WWTM circuit 60 is then disabled, and the cells are read to determine if any cell has been overwritten. A background of solid "1"s are then written into the array. The WWTM circuit 60 is once again enabled, but this time, weak write "0"s are written to the cells word line by word line for a preselected time. Circuit 60 is disabled, and the cells are read. The cells that have been written over—either with "1"s or "0"s—are identified as being defective.

The preselected time for weak writing to a cell is longer than the time for a normal write operation. For example, in a weak write test mode, a weak write to a cell can occur from 20 to 50 times longer than a typical write cycle time. With the types of processors currently being designed, such required weak write testing time is still far shorter than the milliseconds or even seconds that were required with the previous passive methods.

In a typical arrangement, the WWTM circuit 60 is attached at the end of each SRAM cell column in a memory array. Unfortunately, the WWTM circuit is about 1.5 times the size of a normal memory cell 50. Thus, the area consumed by the WWTM circuits for a memory array is problematic. For example, with arrays having 32 rows in each column, the incorporation of WWTM circuits into memory arrays increases their required size by almost 5%. This is unacceptable in applications (e.g., microprocessor cache) where area is a critical issue.

SUMMARY OF THE INVENTION

As indicated above, improvements are required to increase the reliability of SRAM "weak" bitline contacts. For this reason, the active restore weak write test mode has been developed, which will allow for efficient screening of defective SRAM bitline contacts. While it is the intent of the active restore weak write test mode to detect defects in the SRAMs bitline contact, it should be clear to those skilled in the art that defects might occur in other loctaions that will affect the SRAM cells operation. For example, defects in the cells PFET devices (M1 or M2), shown in FIG. 1 will prevent the cell from retaining data. Detecting such defects is the subject of prior art test mode circuits, one of which is refered to as a weak write test mode. It will clear from the following description that the operation and objectives of the referenced prior art weak write test mode are substantively different than the active restore weak write test mode of the present invention.

Accordingly a weak write test mode will be described, which provides a method for detecting cells with insufficient margin write. This described weak write test circuitry is capable of complementing the prior art techniques, or it may be used on its own.

Referring again to FIG. 1A it may know be understood that the write current through the write driver circuit, write bitswitch devices M11, 12, and cell device M6 must be large enough to overcome cell device M2 (PFET of inverter U1, see FIG. 1A) which has been holding node B high prior to the write operation. If the data state of the cell is opposite (logical 0), the current path will be through cell NFET device M5 and must overcome PFET M1. Periodically, defects are introduced during the manufacturing process which limit the amount of current available to overcome the cell PFET devices, resulting in a cell which cannot be written. One such defect results when the single contact, or via, between the bitlines BLT/BLC signals and cell devices M5 and M6 (this via is known as the cells bitline contact) is not opened up properly, resulting in a high resistance. This defect mechanism has become more common as the technology features shrink. A normal bitline contact has a resistance of approximately 20 ohms. If this resistance is large enough the cell cannot be written. A problem arises, however, because the cell will not fail to write until the bitline contact resistance approaches 20K ohms. Therefore, normal testing can pass a cell which is contacted to the bitline by a via only 1/1000 that of a good one. Such vias are barely opened, and any small change will cause the cell,and therefore SRAM to fail in the field. Detecting these marginal defects, in order to prevent such a reliability failure, is the focus of this invention.

Accordingly, it is an objective of the present invention to improve the reliability of the SRAM weak bitline contacts. Another object is to provide controls which are located in the SRAM peripheral circuitry, and not in the critical path.

These and other objects, features, and technical advantages are achieved by providing a write margin technique is to block the bitline restore devices from turning off during the SRAM write cycle. The SRAM write drivers will 'fight' the active restore devices, thereby reducing the amount of current available to write the SRAM cell.

BRIEF DESCRIPTION OF THE DRAWINGS

Embodiments of the present invention are described in conjunction with the accompanying drawings, where like designations denote like elements, and wherein.

DESCRIPTION OF THE INVENTION

Figure 4:
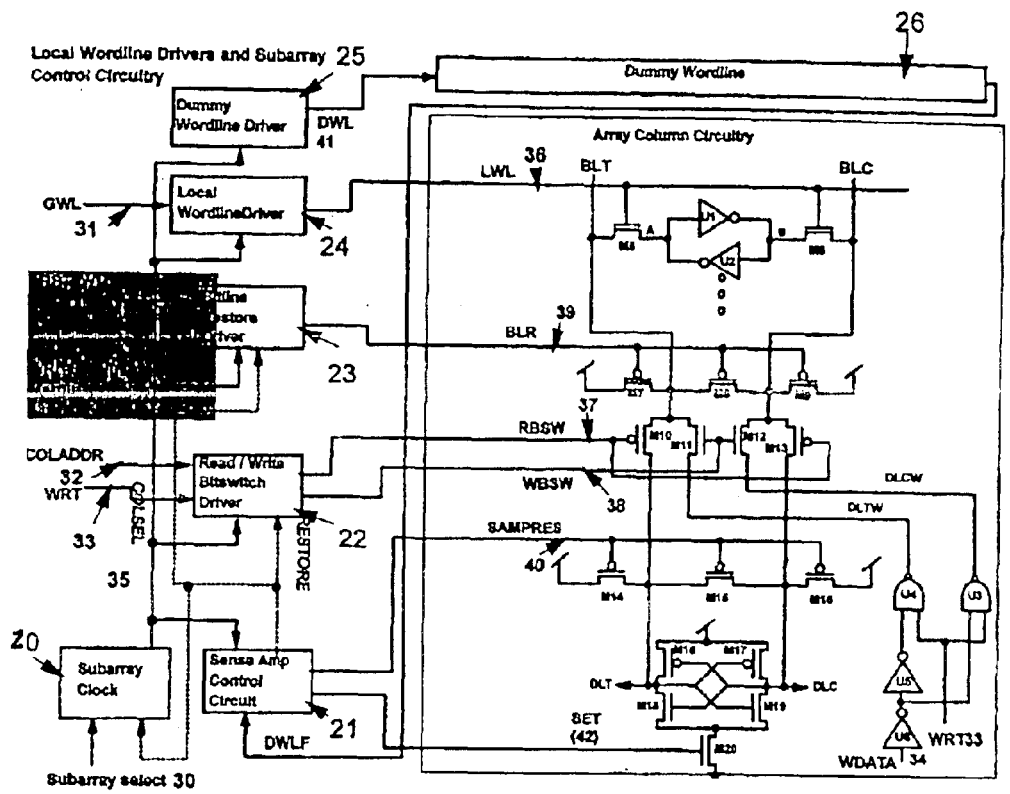
FIG. 4 is a schematic of the SRAM subarray in accordance with the present invention.

Attention is directed to FIG. 4 which shows a block diagram of an SRAM subarray with the elements needed for the active bitline restore write margin test in accordance with the present invention. The elements include a NAND gate U6, a test signal WRITE MARGIN 43, and signal RST_WM 44. During the write margin test, signal WRITE MARGIN 43 will be active high during an SRAM write operation. When COLSEL35 selects high, signal RST_WM 44 will pull low and subsequently prevents BLR 39 for going high and turning off the bitline restore devices M7,M8, and M9 in FIG. 4. The write driver will now have to fight the bitline restore devices in order to discharge either BLT or BLC and subsequently flip (write) the cell. The active bitline restore devices effectively weaken the write and hence make it more difficult to overcome the state of the SRAM cell. With a weaker write, the cell will now start failing for bitline contacts that have resistances as low as 10K ohms. The weak cells (those with bitline contact resistances above 10K ohms) can now be replaced with redundant cells or discarded, and the remaining good cells will have a greater margin to failure; hence a higher level of reliability. The active precharge weak write test mode may be used along with the other SRAM test mode circuits such as those described in U.S. Pat. No. 6,208,572 to further margin the bitline contacts, detecting contacts with a resistance as low as 5K ohms.

Figure 5A:
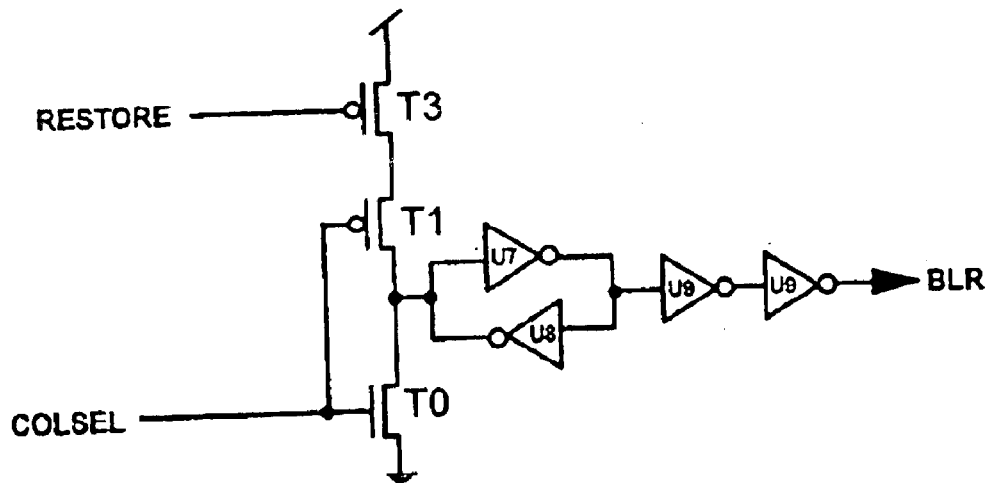
FIG. 5A is an expanded schematic of the restore control circuit shown in FIG. 3.
Figure 5B:
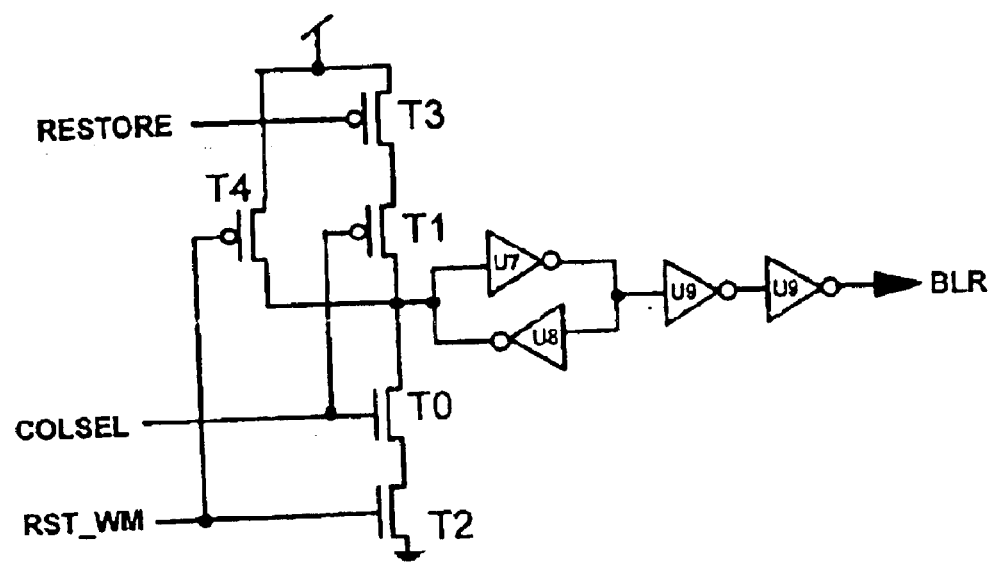
FIG. 5B is an expanded schematic of the restore control circuit shown in FIG. 4.

The bitline restore driver circuit 23 also requires circuitry to accept signal RST_WM. Shown in FIG. 5A is a bitline restore driver circuit without the write margin control inputs. FIG. 5B highlights the necessary elements for the write margin test. Devices T2 and T4 are included in the circuit in FIG. 5B to allow signal RST_WM to force BLR high during the write margining test.

Figure 1A:
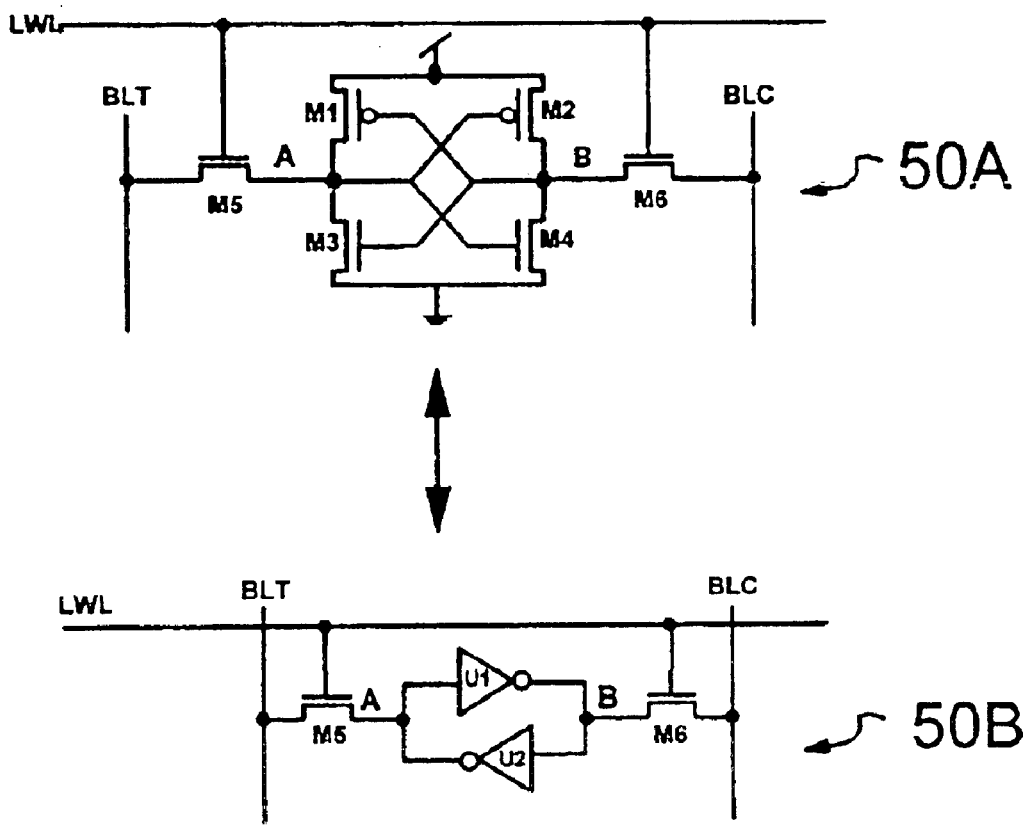
FIG. 1A is a conventional SRAM memory cell.
Figure 1B:
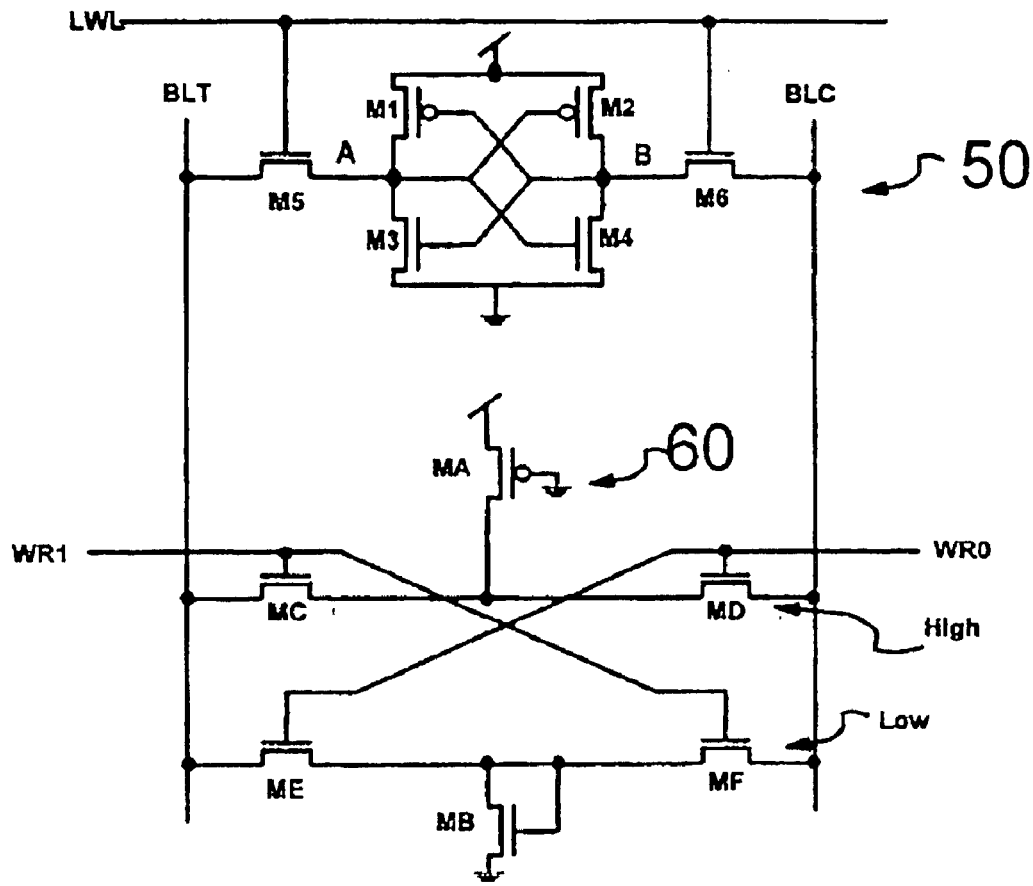
FIG. 1B is a conventional weak write test circuit connected to the memory cell of FIG. 1A.
Figure 2:
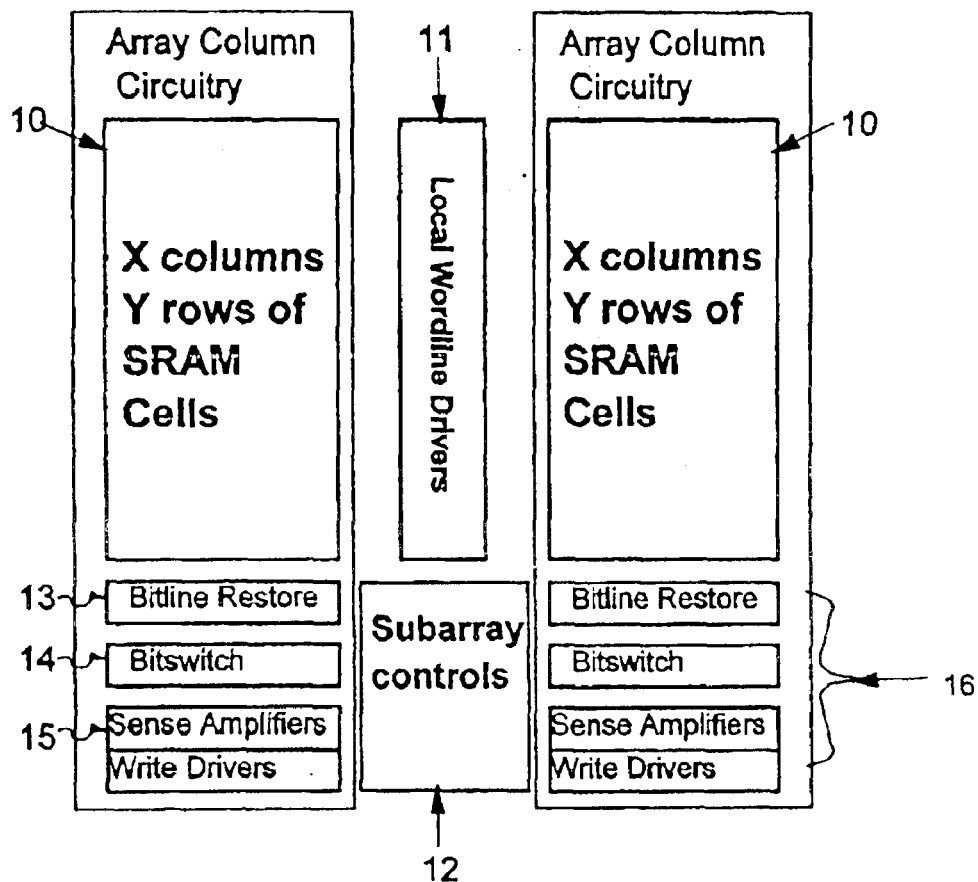
FIG. 2 is a block diagram of an SRAM subarray.
Figure 3:
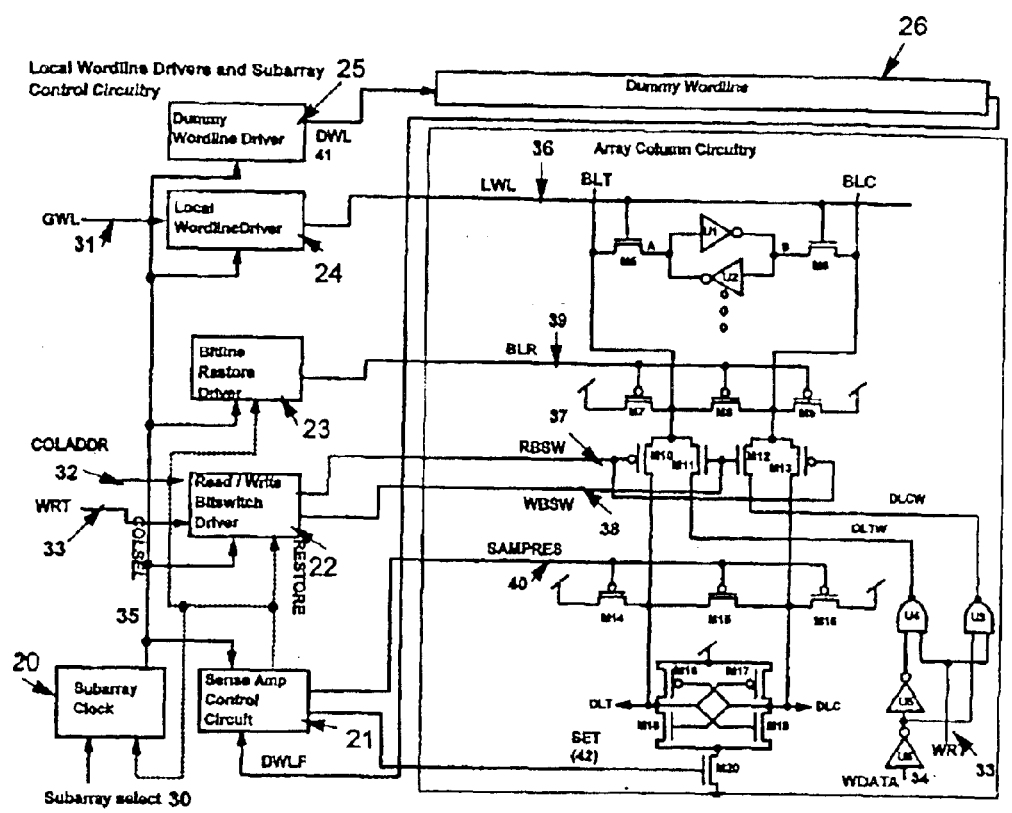
FIG. 3 is a schematic expansion of a conventional SRAM cell subarray shown in FIG. 2.
Figure 6A:
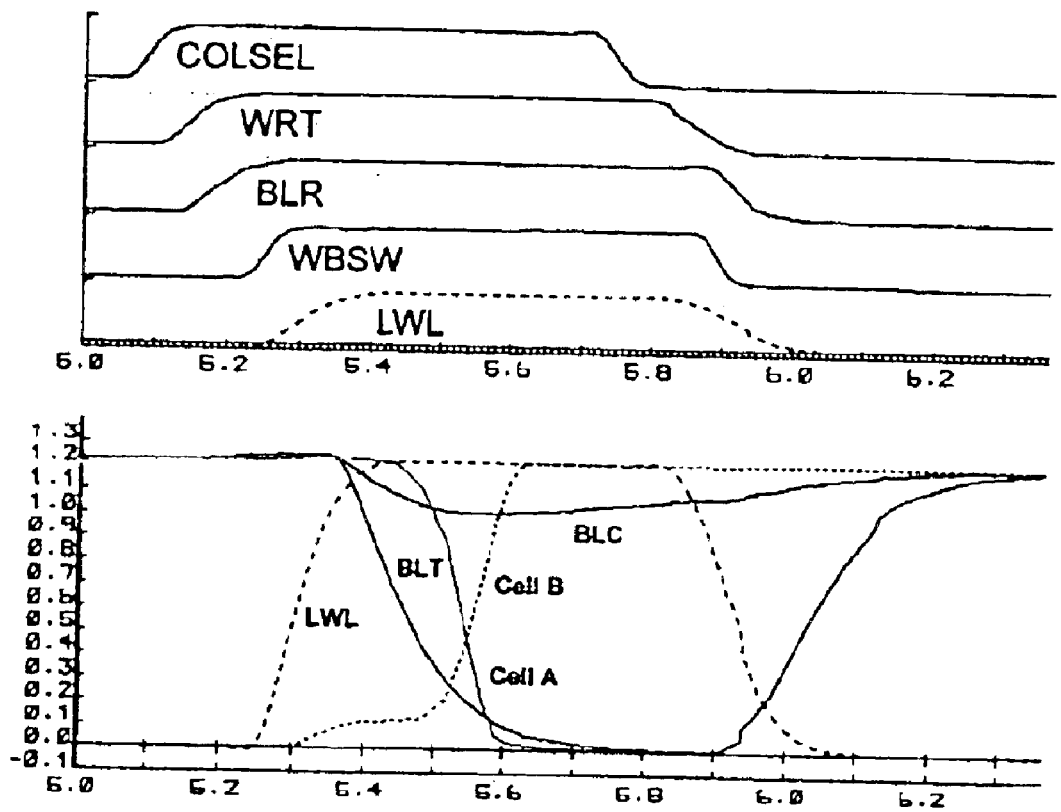
FIG. 6A is a timing diagram showing the operation of the circuit in FIG. 3 for a SRAM write cycle.

Referring to FIG. 3 and the upper graph of FIG. 6A which shows the critical subarray timings for a standard SRAM write cycle in the top graph, and the behavior of the bitlines (BLT/BLC) and cell internal nodes (A/B) in the lower graph. When the subarray is selected for a write cycle signals COLSEL and WRT pulse high. Signal COLSEL drives into the bitline restore driver 23 forcing signal BLR high, subsequently turning off the bitline restore devices M7, M8, and M9. COLSEL will also control the activation of the write bitswitch signal WBSW 38 and the local wordline LWL 36. Referring now to the lower graph of FIG. 6A, the write driver discharges the bitline BLT to ground, while the compliment signal BLC remains high. The cell nodes follow suite and the cell flips state, with node A pulling to ground, and node B driving high to Vdd.

Figure 6B:
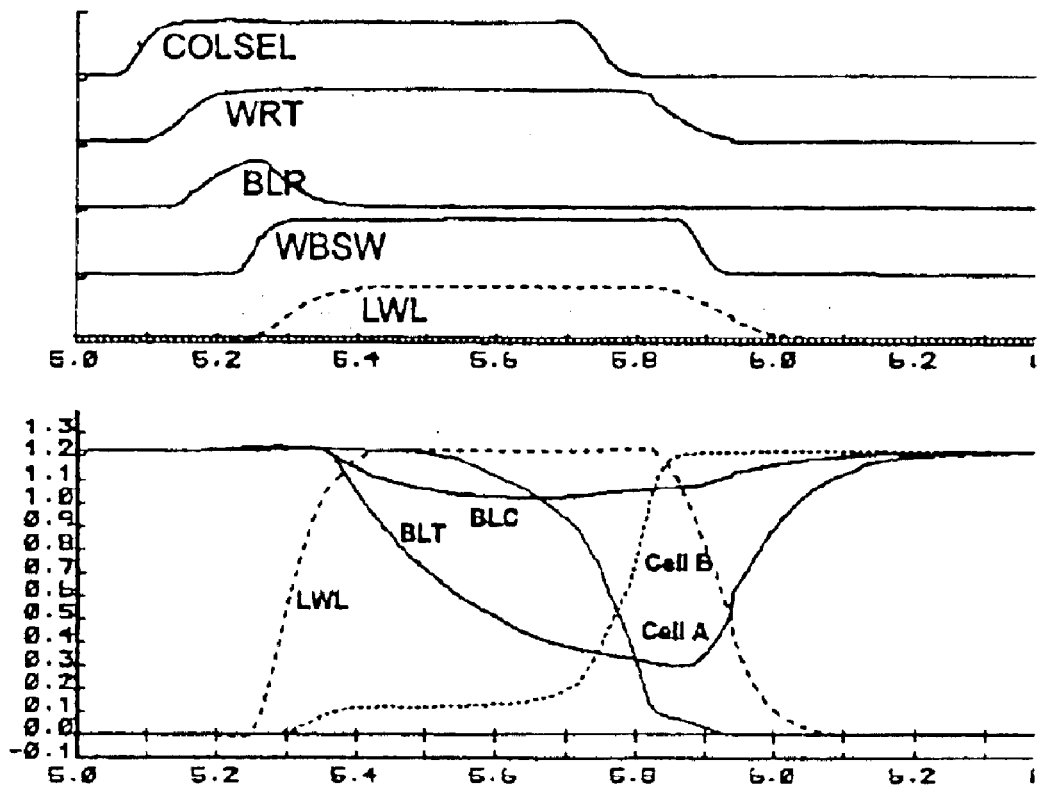
FIG. 6B is a timing diagram showing the operation of the circuit in FIG. 4 for a SRAM write cycle.
Figure 6C:
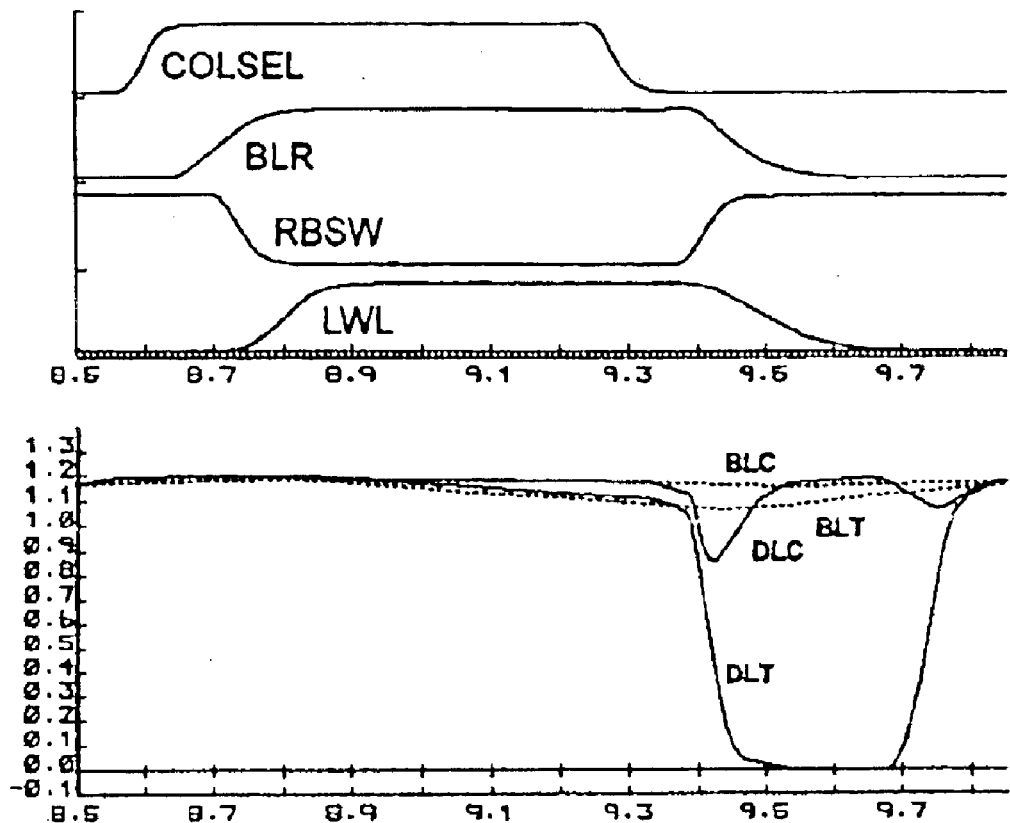
FIG. 6C is a timing diagram showing the operation of a conventional SRAM read.
Figure 1A:
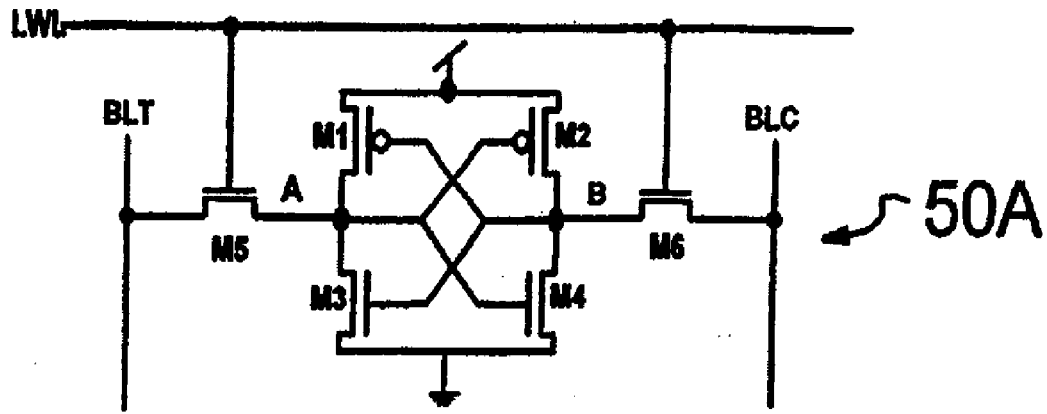
Figure 1A:
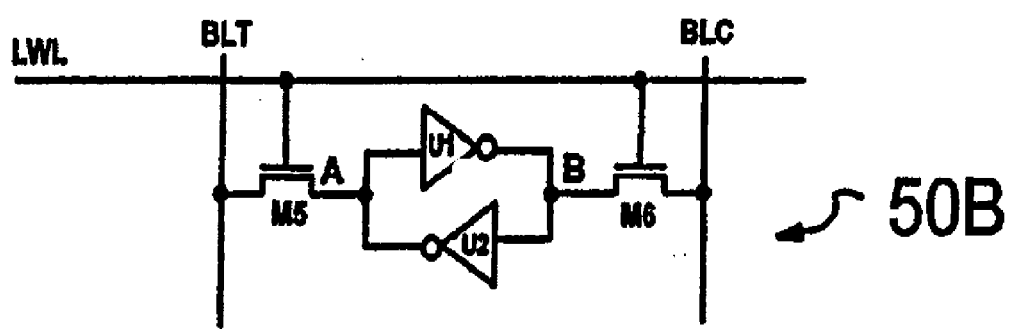
Figure 1B:
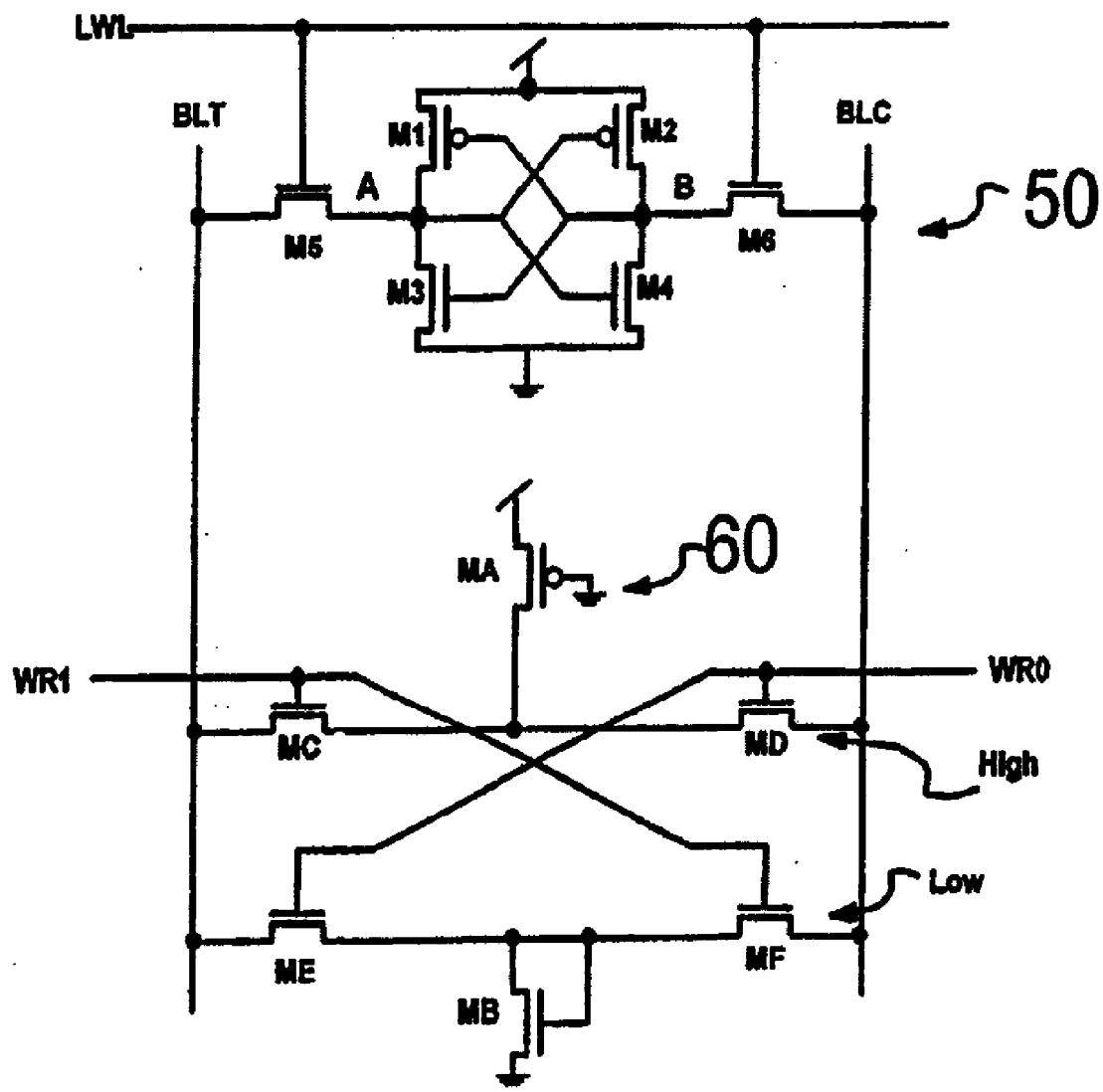
Figure 2:
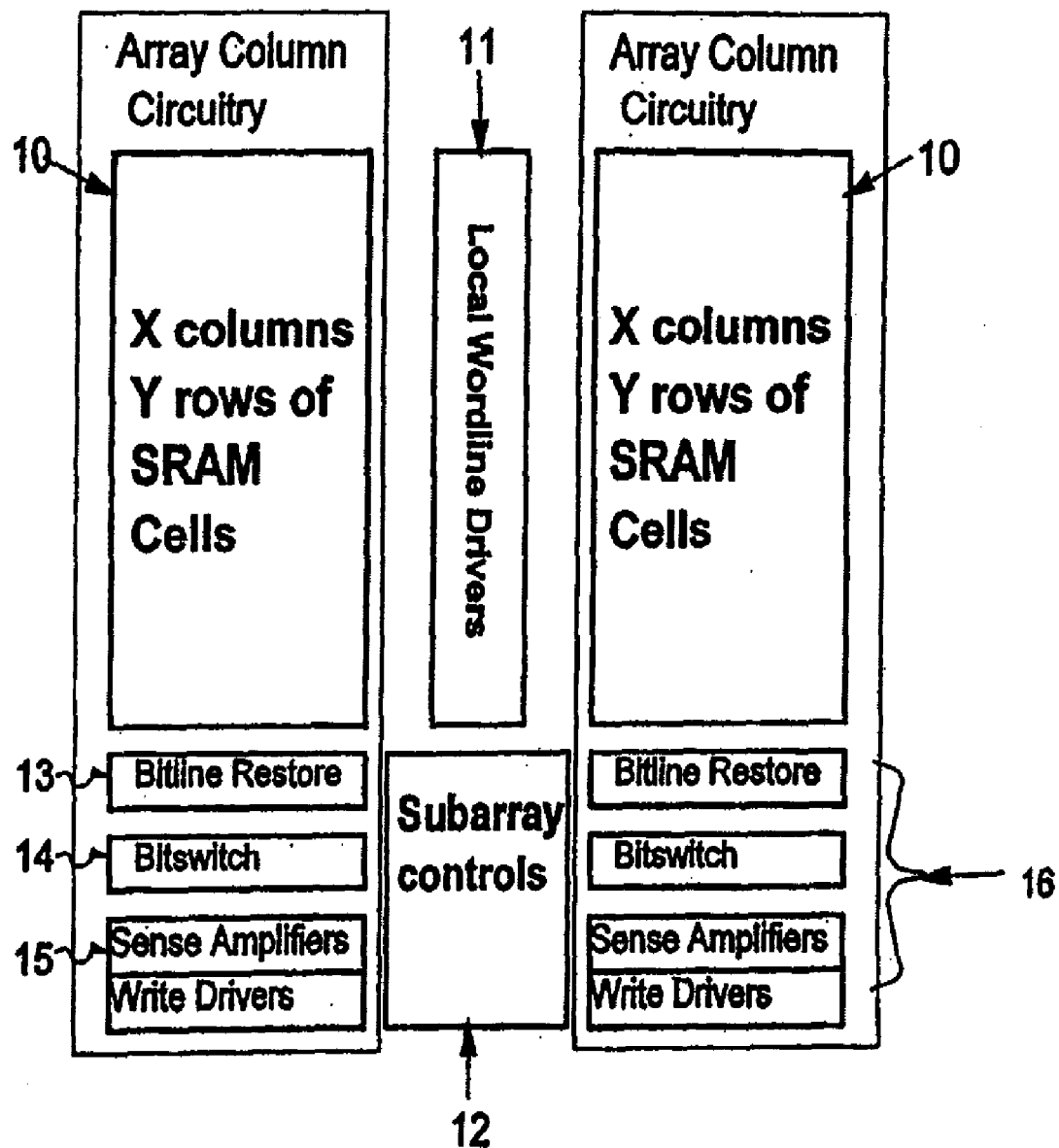
Figure 3:
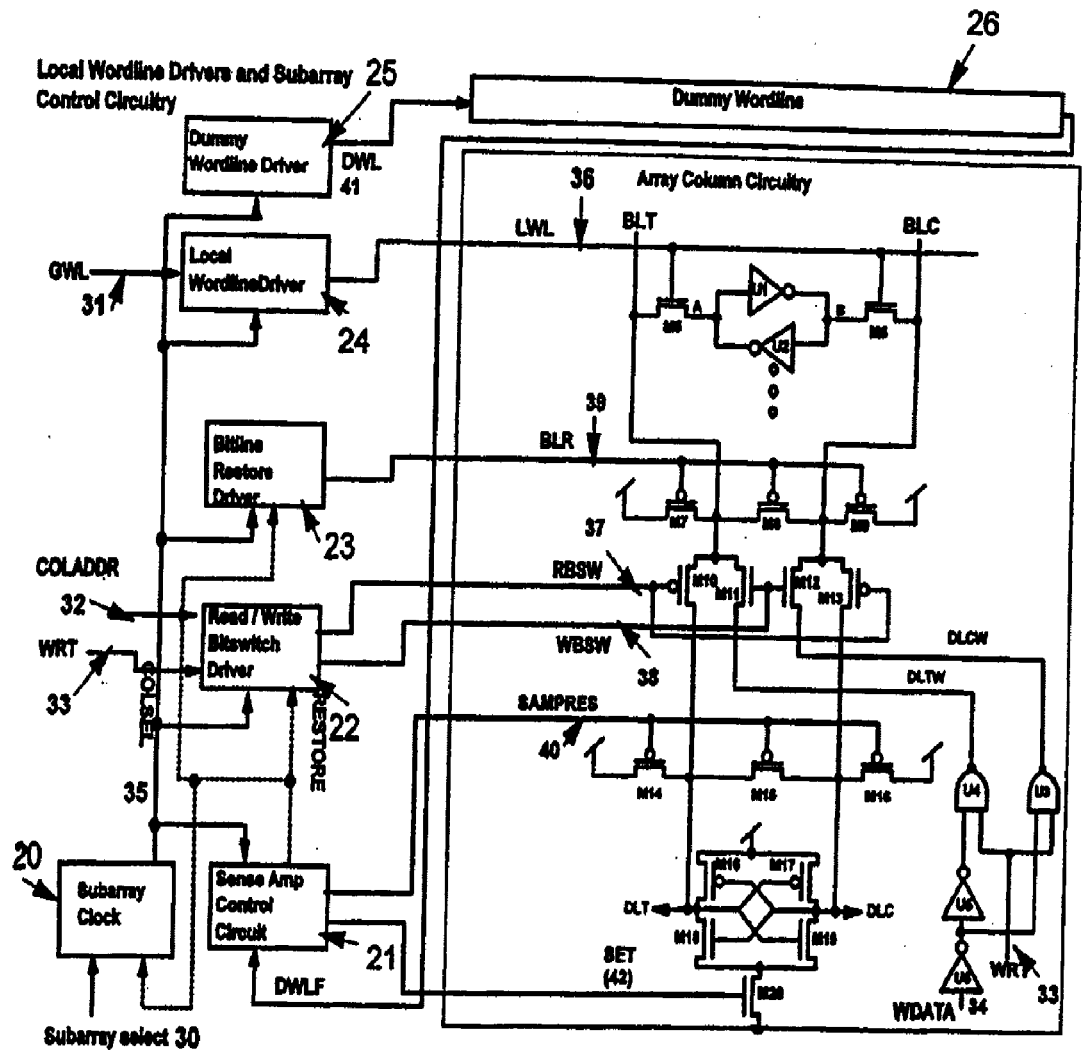
Figure 4:
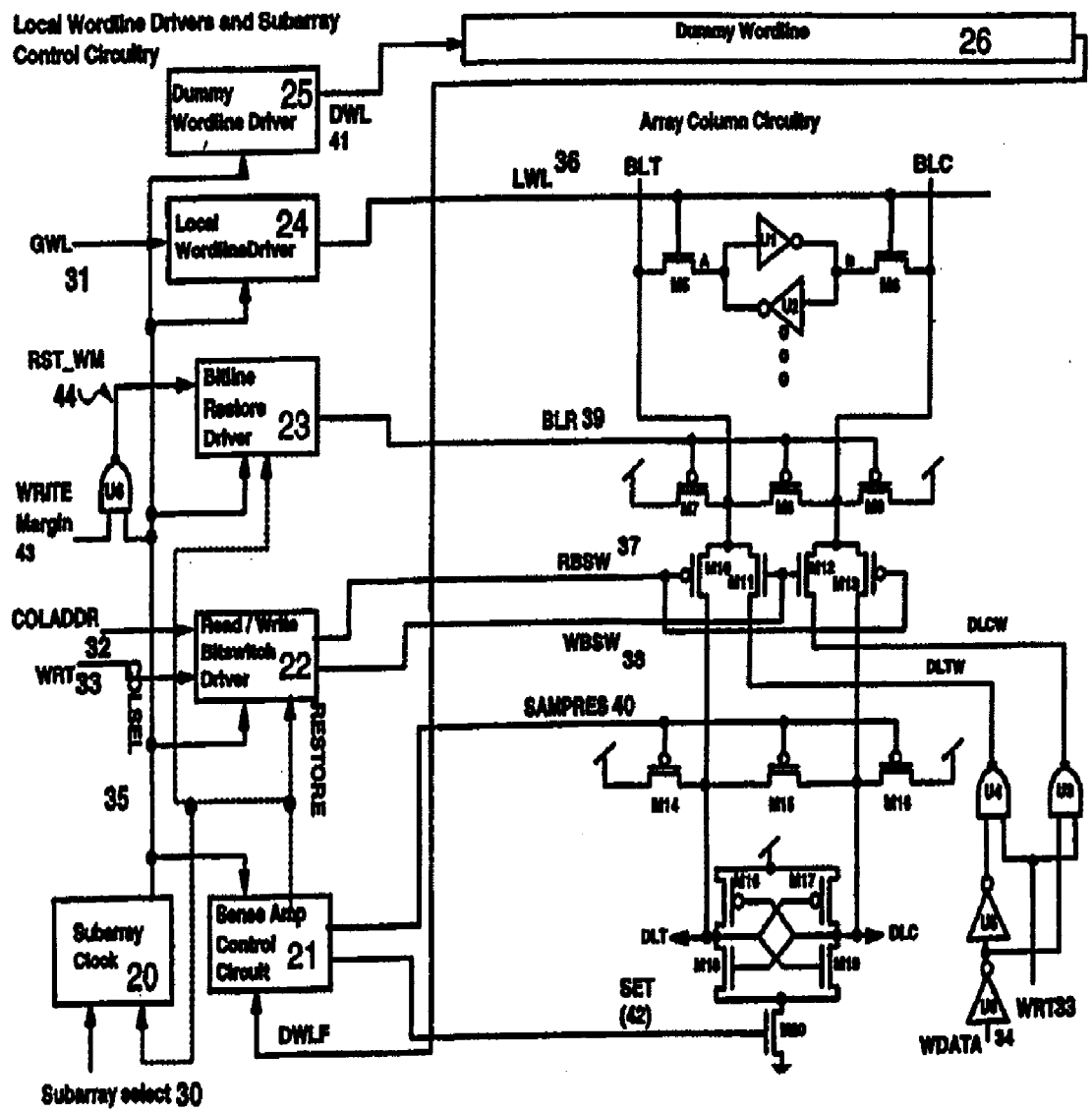
Figure 5A:
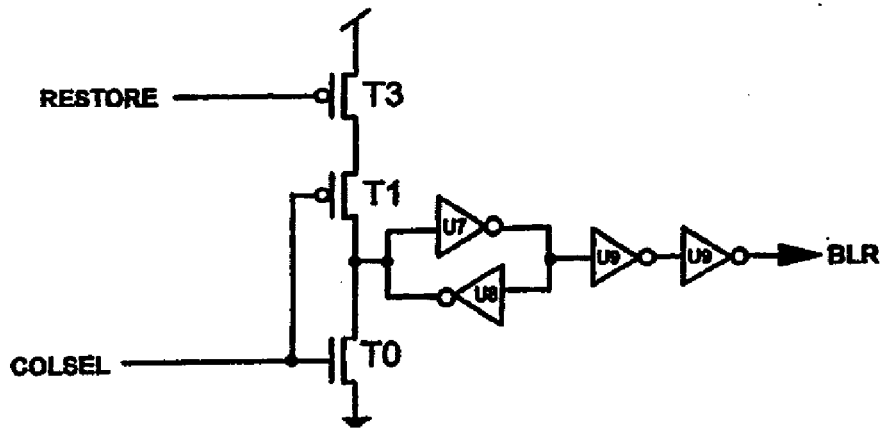
Figure 5B:
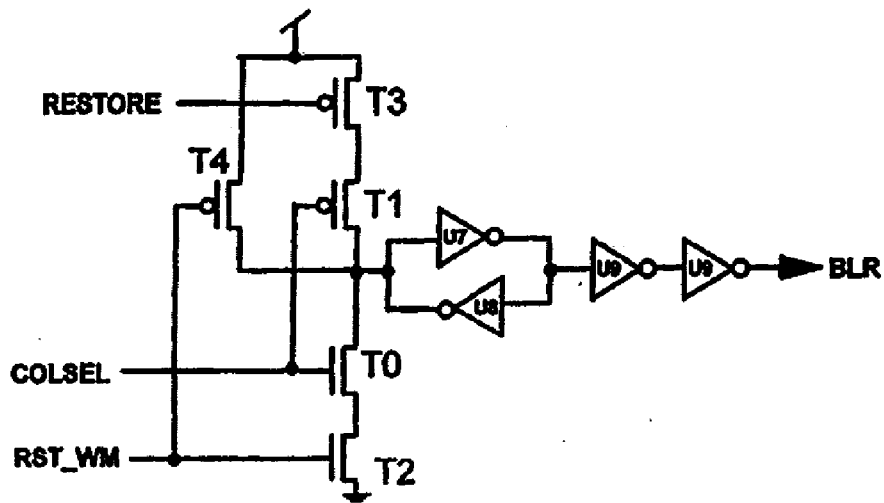
Figure 6A:
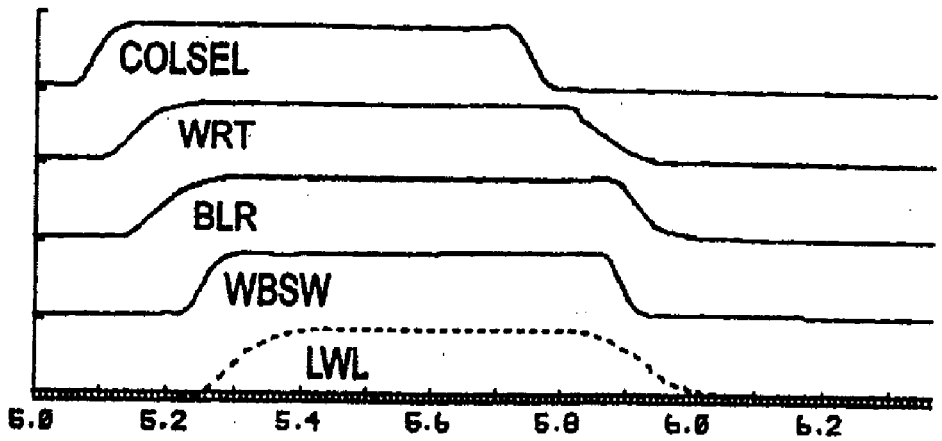
Figure 6A:
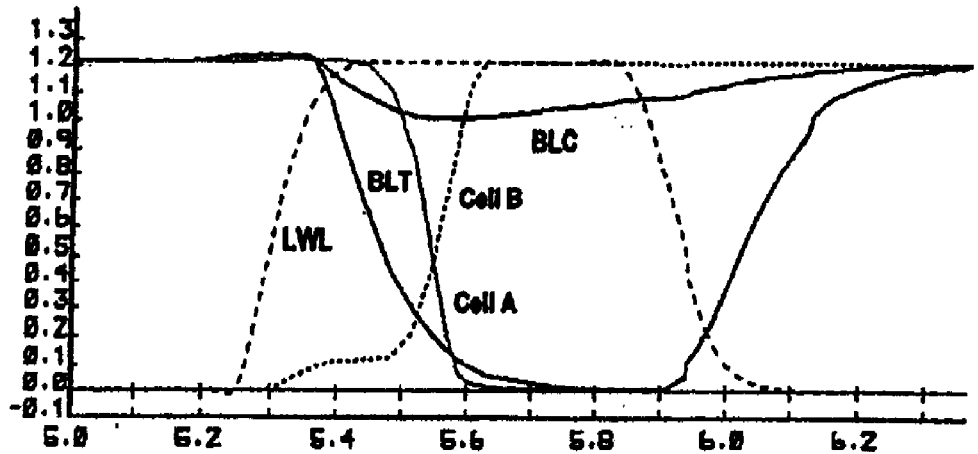
Figure 6B:
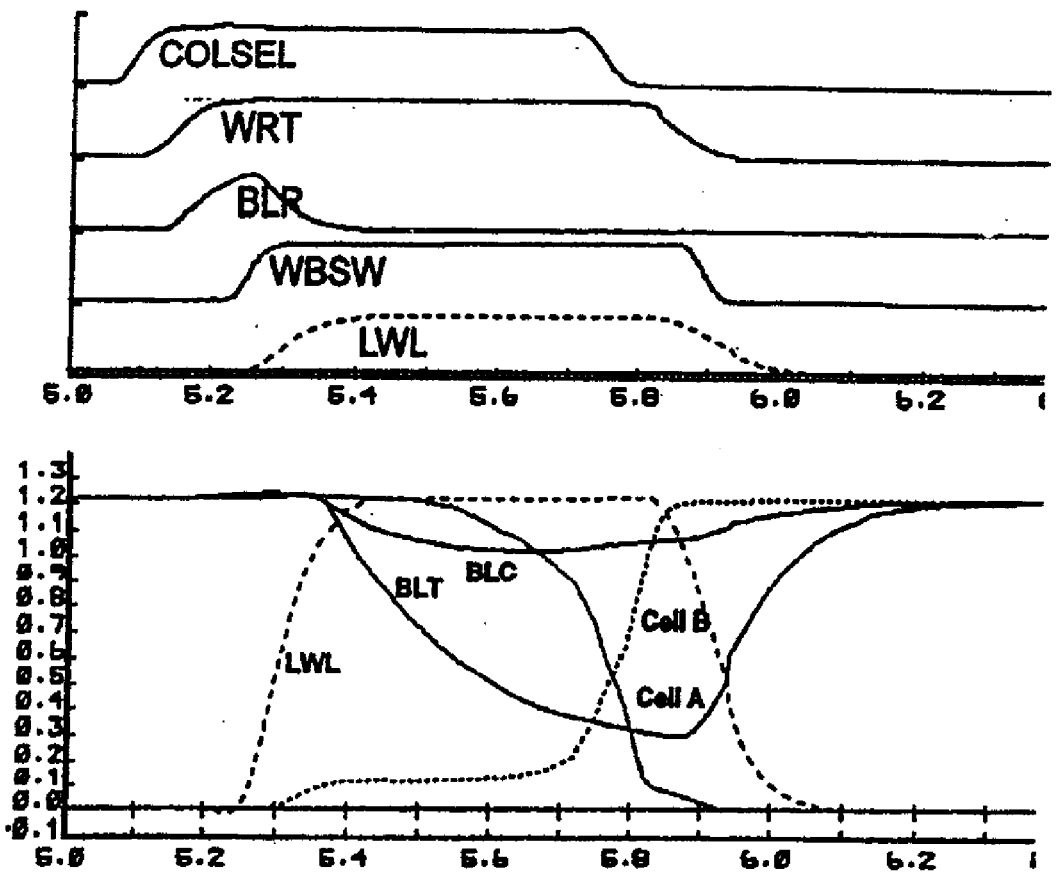
Figure 6C:
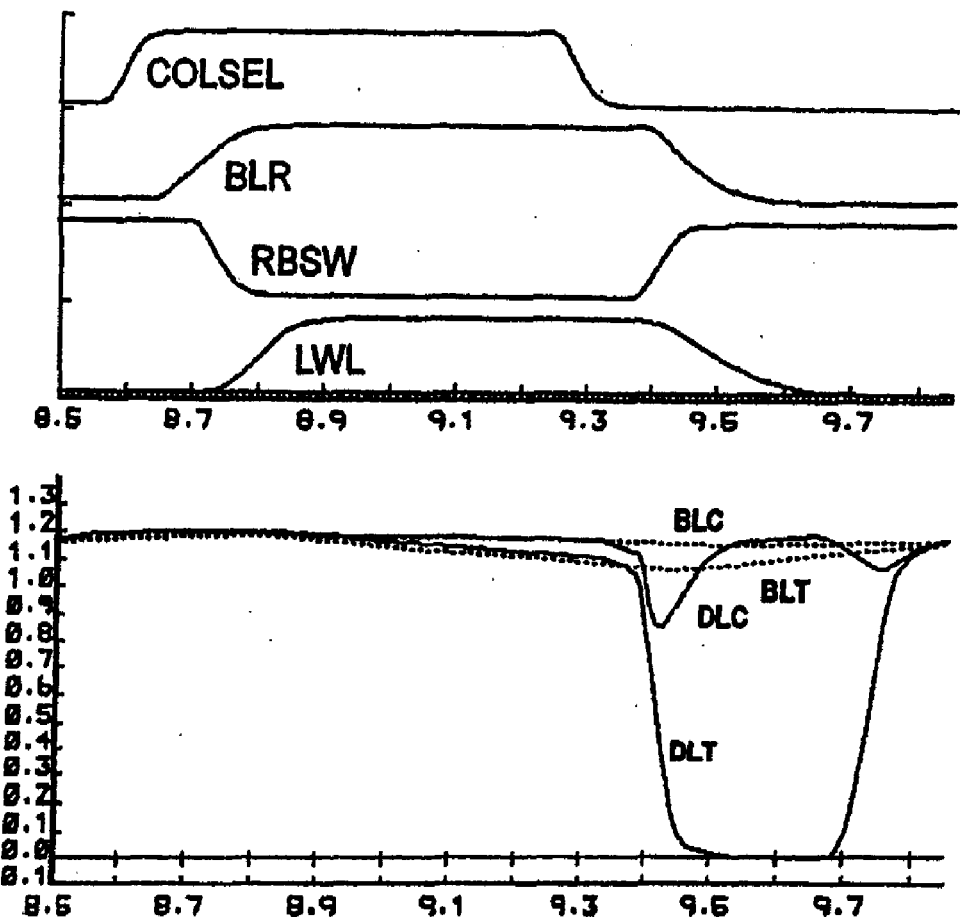

Referring to FIG. 4 and the upper graph of FIG. 6B shows the subarray timings for the active precharge weak write test mode of the present invention. Signals COLSEL and WRT pulse high to start the write cycle. The write bitswitch is opened (WBSW 38 high) and the local wordline (LWL 36) is activated as in the standard write cycle. With the write margin signal high, NAND U6 will pull RST_WM low when COLSEL goes high. RST_WM will block the bitline restore driver 23 from driving the bitline restore signal BLR high, which allows bitline restore devices M7, M8, and M9 to remain on. It should be noted that the timing is arranged such that BLR starts to turn off, but is forced back low in time to prevent the bitline compliment signal (BLT) from reaching ground as shown in FIG. 6B. Referring now to the lower graph of FIG. 6B it can be seen that the active bitline restore drivers prevent BLT from fully discharging to ground. The cell nodes still can flip in this case, but require the cell to be relatively free from defects.

The active restore weak write test mode is conducted as follows: The array is preconditioned to a determined data state with the standard SRAM write. The full array address space is next written to the opposite data state with signal write margin active. The write margin signal is turned off and the contents of the array are read out. Cells that cannot be written during the weak write test are replaced with redundant cells, or the memory chip is discarded. This process is then repeated to stress the opposite data type.

Testing has confirmed that the active bitline restore write margin test doubles the cells sensitivity to resistive defects. Further margining is possible if this is employed along with other techniques described in the prior art. Write driver circuits are used to write data into the cells of a memory array. Like conventional WWTM circuit, a write driver is normally operable connected to a column of cells across the BLT and BLC lines for differentially writing a value into a cell. The present invention takes advantage of the preexistence of a write driver for any memory array by incorporating into the already-existing driver the capability to also perform a weak write operation.

The restore control circuitry of circuit required for the bitline restore margin test adds only two additional transistors to the Bitswitch/Restore 23 circuit. This is a negligible addition in terms of the whole array size. The design of circuit 23 takes advantage of the fact that does not need to be rigorously sized and is placed in the peripheral circuitry and not in the critical pitch area.

It should also be understood that the circuit of the present invention may be effectively used during wafer level testing. Cells that fail the active precharge weak write test can then be replaced with redundant memory elements.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

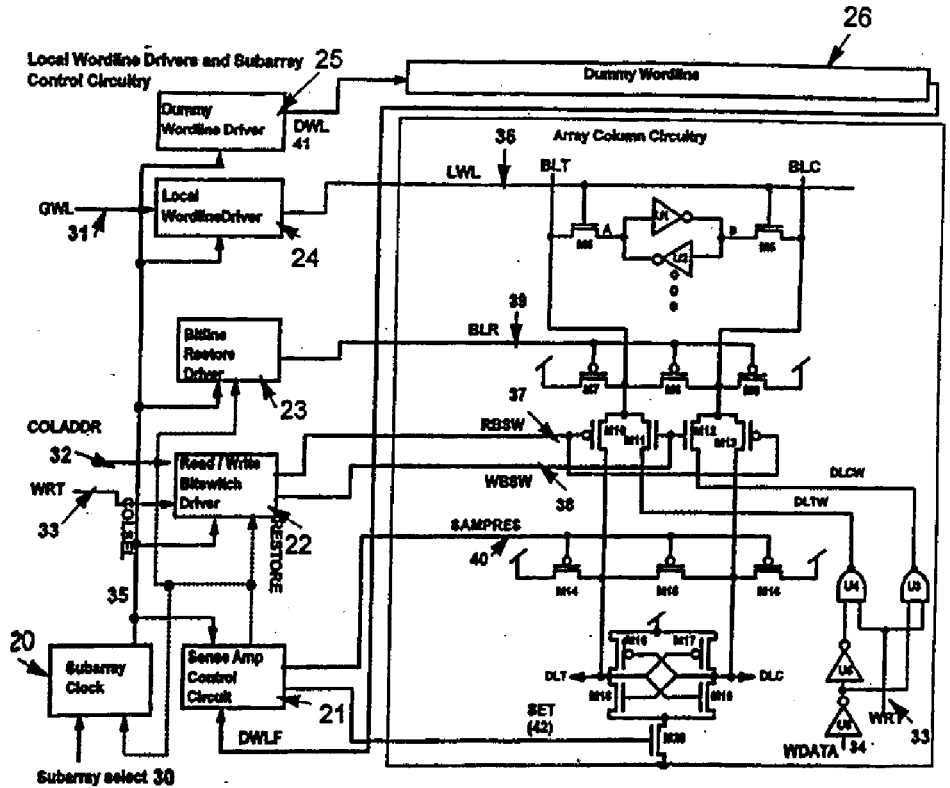

What is claimed is:

1. An active restore circuit for write margin testing of an SRAM having a bitline restore driver comprising:
    a NAND gate connected to the bitline restore driver having three terminals;
    a write margin test signal is applied to the first NAND gate terminal to activate the margin test;
    a sub array clock signal (COLSEC) is applied to the second terminal of the NAND gate which generates a restore signal to the bitline restore driver to block the bitline restore devices from turning off during the SRAM write cycle.

2. The circuit of claim 1 which includes two transistors in the bitline restore driver to assist the bitline driver to block the bitline restore devices from turning off.

3. The circuit of claim 2 wherein cells are identified if they fail the write test margin test.

4. The circuit of claim 3 wherein the identified failed cells are replaced with redundant memory elements.

* * * * *

UNITED STATES PATENT AND TRADEMARK OFFICE
CERTIFICATE OF CORRECTION

PATENT NO.   : 6,829,183 B2
DATED        : December 7, 2004
INVENTOR(S)  : George M. Braceras It is certified that error appears in the above-identified patent and that said Letters Patent is hereby corrected as shown below:

Delete the title page and substitute therefore the attached title page.

Delete Drawing Sheets 1-9 and substitute therefore the attached Drawing Sheets 1-9.

Signed and Sealed this

Thirty-first Day of May, 2005

JON W. DUDAS
*Director of the United States Patent and Trademark Office*

(12) United States Patent
Braceras

(10) Patent No.: US 6,829,183 B2
(45) Date of Patent: Dec. 7, 2004

(54) ACTIVE RESTORE WEAK WRITE TEST MODE

(75) Inventor: George M. Braceras, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/665,254

(22) Filed: Sep. 20, 2003

(65) Prior Publication Data

US 2004/0062105 A1 Apr. 1, 2004

Related U.S. Application Data

(62) Division of application No. 10/064,568, filed on Jul. 26, 2002, now Pat. No. 6,711,076.

(51) Int. Cl.[7] .............................................. G11C 7/00
(52) U.S. Cl. .................. 365/201; 365/200; 365/230.06; 365/185.09; 365/185.2; 365/210
(58) Field of Search ........................... 365/201, 200, 365/230.06, 185.09, 185.2, 210

(56) References Cited

U.S. PATENT DOCUMENTS

| | | | | |
|---|---|---|---|---|
| 5,748,543 A | * | 5/1998 | Lee et al. | 365/200 |
| 5,835,429 A | * | 11/1998 | Schwarz | 365/201 |
| 6,006,339 A | * | 12/1999 | McClure | 713/500 |
| 6,016,281 A | * | 1/2000 | Brox | 365/230.06 |
| 6,192,001 B1 | * | 2/2001 | Weiss et al. | 365/230.06 |
| 6,208,572 B1 | | 3/2001 | Adams et al. | 365/201 |
| 6,333,872 B1 | * | 12/2001 | Ouellette et al. | 365/189.06 |
| 6,449,200 B1 | * | 9/2002 | Nelson et al. | 365/201 |

* cited by examiner

*Primary Examiner*—Connie C. Yoha
(74) *Attorney, Agent, or Firm*—Robert A. Walsh

(57) ABSTRACT

A semiconductor memory device having an active restore weak write test mode for resistive bitline contacts. During the write margin test a circuit is used to block the bitline restore devices from turning off during the SRAM write cycle.

4 Claims, 9 Drawing Sheets